(12) United States Patent
Bawolek (10) Patent No.: US 8,561,288 B2
(45) Date of Patent: Oct. 22, 2013

(54) ELECTRONIC DISPLAY TEST DEVICE AND RELATED METHOD

(75) Inventor: Edward J. Bawolek, Chandler, AZ (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/409,512

(22) Filed: Mar. 1, 2012

(65) Prior Publication Data
US 2012/0159784 A1    Jun. 28, 2012

Related U.S. Application Data

(63) Continuation of application No. PCT/US2010/046700, filed on Aug. 25, 2010.

(60) Provisional application No. 61/240,044, filed on Sep. 4, 2009.

(51) Int. Cl.
H01R 43/02 (2006.01)
(52) U.S. Cl.
USPC .............. 29/743; 29/764; 29/721; 29/729; 29/739
(58) Field of Classification Search
USPC ............. 29/740–743, 834, 402.03, 764, 759; 294/64.8; 414/744.6, 744.8
See application file for complete search history.

(56) References Cited

U.S. PATENT DOCUMENTS

| | | | | |
|---|---|---|---|---|
| 4,528,746 A | * | 7/1985 | Yoshimura | 29/743 |
| 4,733,462 A | * | 3/1988 | Kawatani | 29/840 |
| 4,883,300 A | * | 11/1989 | Akagawa | 294/2 |
| 4,956,911 A | * | 9/1990 | Zaremba et al. | 29/721 |
| 5,314,223 A | * | 5/1994 | Harper et al. | 294/185 |
| 6,064,195 A | | 5/2000 | Clayton et al. | |
| 6,119,460 A | * | 9/2000 | Huang | 62/3.3 |
| 6,515,497 B1 | | 2/2003 | Matsuzawa | |
| 8,025,323 B2 | * | 9/2011 | Ransom | 294/65 |

FOREIGN PATENT DOCUMENTS

JP    03-221870 A    9/1991
JP    10-335032 A    12/1998

OTHER PUBLICATIONS

ISR and Written Opinion for corresponding Int'l Application No. PCT/US2010/046700 dated Aug. 25, 2010.

* cited by examiner

Primary Examiner — Minh Trinh
(74) Attorney, Agent, or Firm — Bryan Cave LLP (57) ABSTRACT

Some embodiments include a connection device for electrically coupling an electrical device to a test system. The connection device can include at least one suction cup configured to be coupled to the electrical device, spring loaded connector pins configured to electrically couple the electrical device to the test system, and a support frame coupled to the at least one suction cup and the spring loaded connector pins. The at least one suction cup can include three suction cups including a first suction cup, a second suction cup, and a third suction cup, and the support frame can include a first end coupled to the first suction cup, a second end opposite the first end and coupled to the second suction cup, and a third end between the first and second ends and coupled to the third suction cup. Other embodiments of related devices and methods are also described herein.

9 Claims, 5 Drawing Sheets

ELECTRONIC DISPLAY TEST DEVICE AND RELATED METHOD

CROSS-REFERENCE TO RELATED APPLICATIONS

This application is a continuation of International Patent Application Serial No. PCT/US2010/046700, filed Aug. 25, 2010. International Patent Application Serial No. PCT/US2010/046700 claims the benefit of U.S. Provisional Application Ser. No. 61/240,044, filed Sep. 4, 2009. International Patent Application Serial No. PCT/US2010/046700 and U.S. Provisional Application Ser. No. 61/240,044 are incorporated herein by reference in their entirety.

STATEMENT REGARDING FEDERALLY SPONSORED RESEARCH OR DEVELOPMENT

The U.S. Government has a paid-up license in this invention and the right in limited circumstances to require the patent owner to license to others on reasonable terms as provided by the terms of Grant/Contract No. W911NF-04-2-0005 by the Army Research Lab (ARL).

FIELD OF THE INVENTION

The present invention relates generally to methods and devices for making electrical connections. More particularly, the present invention relates to the testing of electronic devices using electrical connections.

BACKGROUND OF THE INVENTION

A wide variety of electronic devices are manufactured, and each of these electronic devices needs to be electrically tested. As an example, electrical testing can be conducted to determine if the electronic devices have any defects, such as, short circuits, open circuits, and other manufacturing defects.

Many test apparatuses are bulky and expensive, and can test only one type of electronic device. In addition, those test apparatuses that can be custom fitted to test more than one type of electronic device often require a great deal of time and effort to be modified or otherwise prepared to test a different type of electronic device.

BRIEF DESCRIPTION OF THE DRAWINGS

To facilitate further description of the embodiments, the following drawings are provided in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

Some embodiments of the present invention provide for a device for making electrical connections. In some examples, the device can be attached quickly to an electronic device under test, such as, for example, a panel or substrate. In addition, in the same or other embodiments, a device for making electrical connections can be relocated quickly from one electronic device under test to another electronic device under test. In addition, in the same or other embodiments, the device for making electrical connections can be aligned properly to an electronic device under test with only the user's vision, i.e., no magnification or complex jigs are required. The device eliminates the need for customized fixtures and fragile probe cards.

Some embodiments include a device for making electrical connections. The device can include: at least one suction cup;

spring loaded connector pins; and a first support frame adjacent to the at least one suction cup and the spring loaded connector pins.

In other embodiments, a device for making electrical connections can include: a frame; suction cups coupled to the frame; spring loaded connector pins coupled to the frame; and a vacuum line supplying a vacuum pressure to the suction cups at a first time; wherein the suction cups are configured to be coupled to a surface of an electronic device at the first time and wherein the spring loaded connector pins are configured to be in contact with the surface of the electronic device at the first time.

Some further embodiments include a method of making electrical connections. The method can include: placing suction cups of a connection device at a surface of an electronic device; supplying a suction force to the suction cups so that the suction cups are coupled to the surface of the electronic device; coupling spring loaded connector pins to contact pads of the electronic device; and using the connection device to conduct electrical tests of the electronic device.

Figure 1:
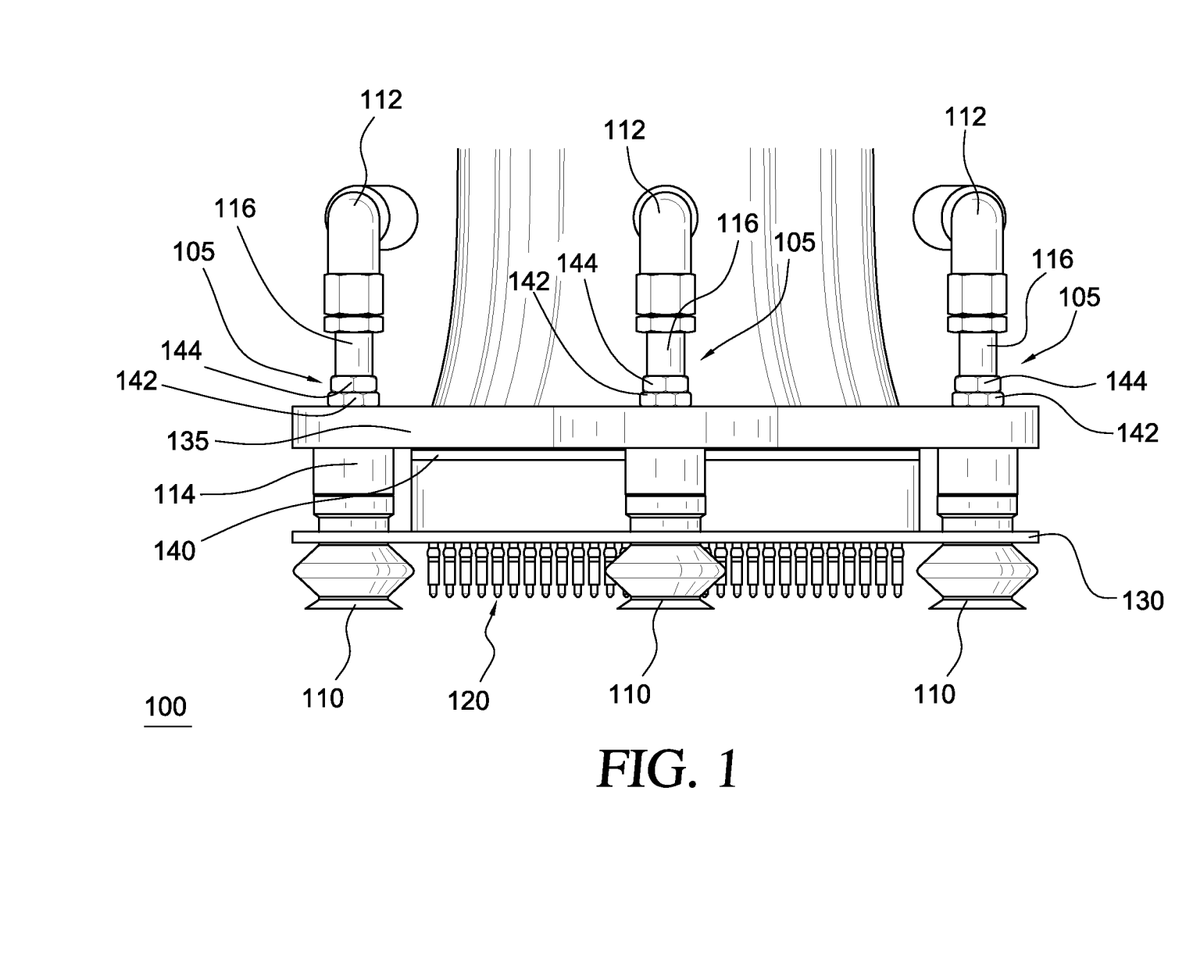
FIG. 1 is a front view of an example of an embodiment of a device for making electrical connections.
Figure 2:
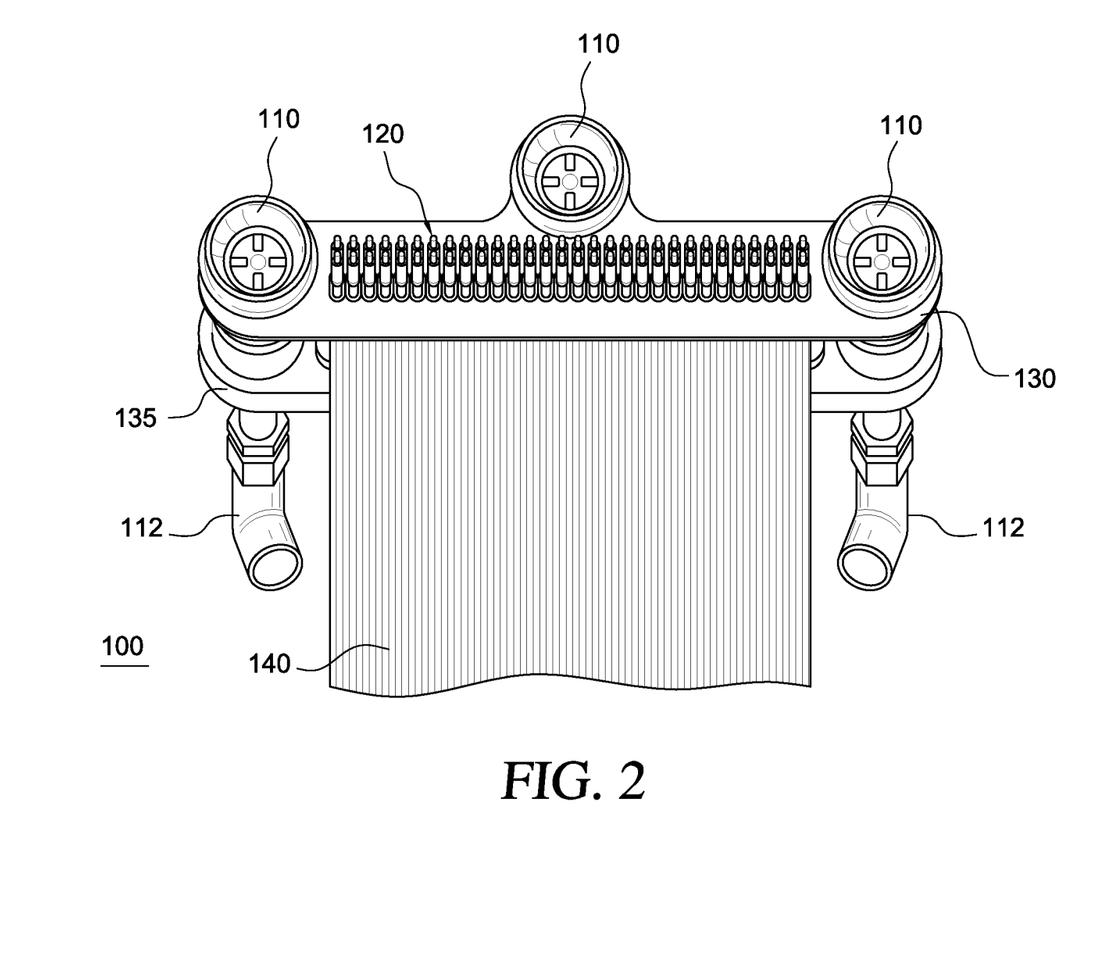
FIG. 2 is a bottom and rear perspective view of the example of the embodiment of FIG. 1.

Turning to the drawings, FIG. 1 illustrates a front view of an example of a device 100 for making electrical connections, and FIG. 2 illustrates a bottom and rear perspective view of the example of FIG. 1. In the same or different embodiments, device 100 can be considered a device for testing displays, such as, for example, the backplanes of flexible displays. Device 100 is exemplary and is not limited to the embodiments presented herein. Device 100 can be employed in different embodiments not depicted or described herein.

Device 100 includes spring loaded connector pins 120. Any spring loaded connector pins can be used. In one example, 0.235 inch (5.969 millimeter) spring loaded connector pins from Mill-Max of Oyster Bay, New York can be used. In some embodiments, pins 120 can be referred to as pogo pins. Spring loaded connector pins 120 are coupled to a support 130. Support 130 can be any material that is strong enough to provide support to pins 120. In addition, support 130 should be able to be manipulated to allow pins 120 to be coupled to support 130. For example, in one embodiment, holes are drilled into support 130 and a single pin of pins 120 is positioned into each of the drilled holes. In one example, support 130 can be made from a material used to make printed circuit boards, such as, for example, polyester material and/or Flame Retardant 4 (FR-4) laminate.

Figure 3:
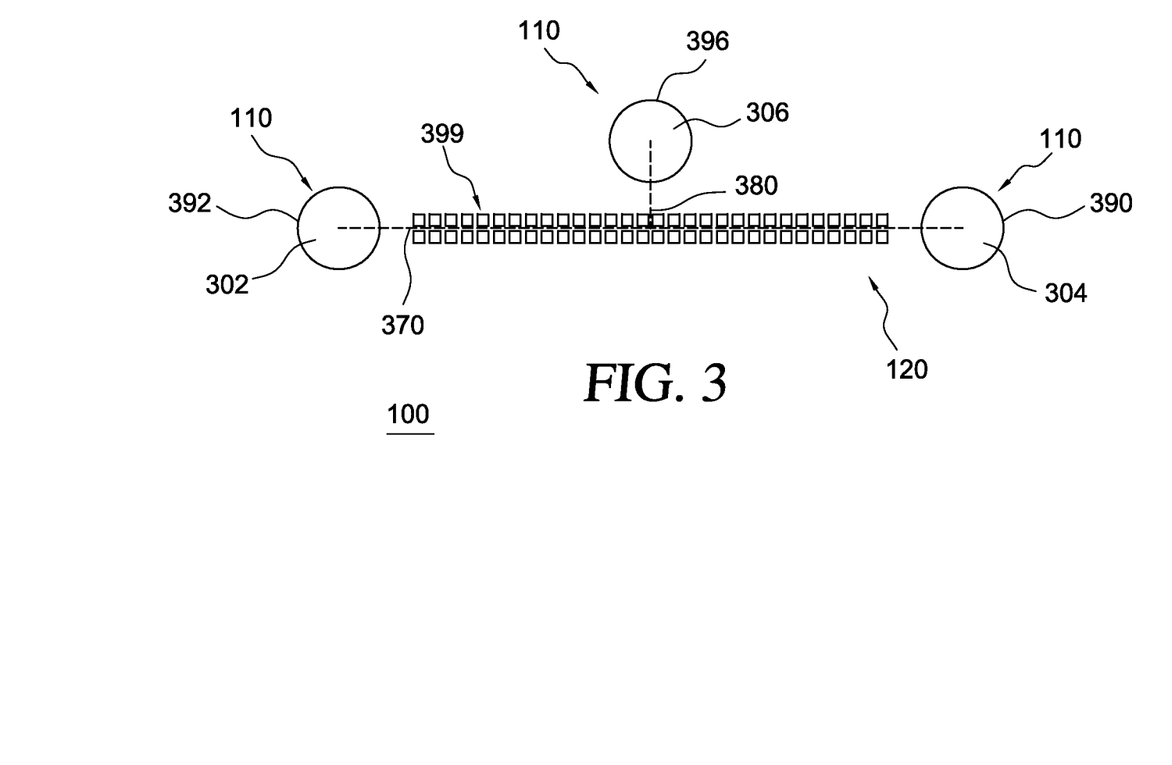
FIG. 3 is a diagram of the example of the embodiment of FIG. 1.

Pins 120 can be arranged in any pattern and contain any number of pins that allows device 100 to make an electrical connection with the electronic device being tested. In one example, pins 120 are arranged into rows and columns. As illustrated in FIG. 3, which illustrates a diagram of an example of the bottom of device 100, pins 120 are arranged into two rows and thirty columns, for a total of 60 pins. In addition, each of pins 120 can be positioned 0.10 inches (2.54 millimeters) from the next pin. This spacing is convenient, as it is the spacing of standardized ribbon cable connectors that can be electrically coupled to pins 120 to send data, power and/or other electrical signals to contact pads of the electronic device being tested and/or to receive such signals from the contact pads.

In the example of FIGS. 1 and 2, pins 120 are placed into holes drilled into support 130. Pins 120 can then be soldered into place. Different portions of pins 120 can protrude from opposite sides of support 130. A connection can be made with the portions of pins 130 protruding from the top side of support 130. As an example, the end of pins 120 that protrudes from the top side of support 130 can be coupled to a connector 140, such as, a ribbon connector.

Connector 140 can be used to send signals between pins 120 and a testing system (not shown.) As an example, connector 140 can be a standard ribbon cable connector. In other examples, different types of connectors can be used. For example, each single pin of pins 120 can be connected to the testing system via a separate wire connection. Furthermore, multiple testing systems can be used interchangeably with device 100. For example, one testing system can be connected to device 100 and can be used for testing for short circuits in a flexible display. In another example, a different testing system can be connected to device 100 that will test the illumination of the same or a different type of flexible display.

Device 100 can also have a mechanism for attaching device 100 to an electronic device that is being tested. The example illustrated in the embodiment of FIG. 1 shows device 100, which can use vacuum pressure to become attached to the electronic device being tested.

Device 100 can include vacuum connectors 105. Vacuum connectors 105 can include suction cups 110. Suction cups 110 and other parts of vacuum connectors 105 can be coupled to support 130. Suction cups 110, in connection with a vacuum pressure, can be used to attach device 100 to the electronic device being tested. In some examples, suction cups 110 can attach to the electronic device being tested with the natural suction nature of suction cups 110 and without using any additional or external suction or vacuum. In other examples, suction cups 110 can be attached to a vacuum line (not show in FIG. 1) that will create a stronger suction pressure between suction cups 110 and the electronic device being tested, thereby creating a stronger attachment between suction cups 110 and the electronic device being tested.

Device 100 can include any number of suctions cups 110 so that device 100 is securely attached to the electronic device being tested. In one embodiment, there are two suction cups 110 present on device 100. In such an embodiment, one suction cup 110 can be positioned on one end of support 130, and the other suction cup 110 can be positioned on the end of support 130 opposite to the first suction cup 110.

In other embodiments, and as illustrated in FIGS. 1 and 2, device 100 can include three suction cups 110. By adding a third suction cup to the two suction cups of the previous embodiment, the stability of device 100 when in use can be improved over a two suction cup configuration.

Suction cups 110 can comprise any material that will suitably attach to the electronic device being tested with the addition of the vacuum pressure. In some examples, suction cups 110 comprise a material that has benefits, such as having an extended temperature range, low particulate contamination, which can help reduce abrasion on the device being tested, and the like. As an example, silicon rubber or fluoro rubber, provided by SMC Corporation of Noblesville, Indiana, are materials that have an extended temperature range and/or low particulate contamination.

In the same or other examples, suction cups 110 can comprise a conductive material. Suction cups that comprise a conductive material can help protect the electronic device being tested from electrostatic damage. In embodiments where suction cups 110 comprise a conductive material, the point(s) on the electronic device being tested where suction cups 110 make contact with the electronic device being tested can be configured to provide an electrical connection for suction cups 110. This electrical connection can provide an electrical ground. As an example, suction cups can comprise conductive nitrile butadiene rubber (NBR) provided by provided by SMC Corporation.

When device 100 is not in use, and there is not a suction pressure applied to suction cups 110, suction cups 110 extend a first distance below the support 130. In addition, pins 120 will extend a second distance below support 130. In some embodiments the first distance is greater than the second distance. As an example, if device 100 is not in use and is placed on top of a surface with suction cups 110 on the surface, pins 120 will not come into contact with the surface until device 100 is in use. In other embodiments, the first distance is not greater than the second distance.

FIG. 3 illustrates a diagram of an example of the bottom of device 100. Device 100 has three of suction cups 110 (namely, suction cups 302, 304, and 306) and sixty of pins 120. In the example of FIG. 3, pins 120 are arranged into two rows and thirty columns. An axis 370 divides the two rows, and an axis 380 divides the columns in half, i.e., fifteen columns on one side of axis 380 and fifteen columns on the other side of axis 380. In some examples, axis 370 is perpendicular to axis 380.

Suction cup 302 can be positioned at one end of axis 370, and another suction cup 304 can be positioned on the other end of axis 370. In some examples, the center of suction cup 302 and the center of suction cup 304 lie on axis 370. In addition, in the same or other examples, the center of suctions cups 302 and 304 lie the same distance from the end pin of pins 120 nearest to the respective suction cup 302 or 304. In other embodiments, the centers of suction cups 302 and/or 304 do not lie on axis 370 and/or are not equidistant from axis 380. In the illustrated embodiment, all of pins 120 are located between suction cups 302 and 304.

In addition, suction cup 306 can be positioned so that the center of suction cup 306 lies on axis 380. In some examples, the center of suction cups 302 and/or 304 do not have to lie on axis 370. In the same or other examples, the center of suction cup 306 does not lie on axis 380. In the illustrated embodiment, the center of suction cup 306 does not lie on axis 370 and is not co-linear with suction cups 302 and 304.

The size of suction cups 110 can also be adjusted to increase or decrease the amount of pressure used to attach device 100 to the electronic device being tested. Larger perimeters for suction cups 110 enable suction cups 110 to provide a greater amount of force to attach device 100 to the electronic device. In some examples, all of suction cups 110 can be the same size. In other examples, suction cup 302 is the same size as suction cup 304, while suction cup 306 is a different size from suction cups 302 and 304. In yet other examples, each of suction cups 302, 304, and 306 is a different size. In one example, each of suction cups 302, 304, and 306 can be a 13 millimeter (mm) diameter suction cup provided by SMC Corporation.

It should also be noted that FIG. 3 can represent a surface of the electronic device being tested. In such an embodiment, circles 392, 390, and 396 represent markers present on the surface of the electronic device being tested. In one example, a user can place suction cups 110 inside circles 392, 390, and 396. These markers can help the user properly align device 100 on the electronic device being tested. In addition, square boxes 399 can represent contact points on the electronic device being tested. When properly aligned, each individual contact point 399 will align with a corresponding pin 120.

As shown in FIG. 1, vacuum connectors 105 can also include first portions 114, second portions 116, and elbows 112. Suction cups 110 can be coupled to first portions 114 of vacuum connectors 105. First portions 114 can also be coupled to second portions 116 of vacuum connectors 105. Second portions 116 can also be coupled to elbows 112. In addition, elbows 112 can be coupled to a vacuum line (not shown), which can create and/or increase the vacuum pressure used to attach device 100 to the electronic device being tested.

Device 100 can also include an optional stabilizer 135. Stabilizer 135 can provide additional support and mechanical stability to device 100. Stabilizer can be attached to device 100 via vacuum connectors 105. For example, stabilizer 135 can be coupled to vacuum connectors 105 between each of first portions 114 and second portions 116. Because vacuum connectors 105 include suction cups 110, stabilizer 135 can help place suction cups 110 into their proper alignments. In addition, stabilizer 135 can also help suction cups 110 maintain the proper alignment while device 100 is in use. Stabilizer 135 can be any material that provides rigidity and/or support to device 100. In some examples, stabilizer 135 comprises an acrylic material.

In some embodiments, stabilizer 135 is positioned proximate to connector 140. Stabilizer 135 can be positioned so that stabilizer 135 can help prevent connector 140 from being disconnected from pins 120.

Device 100 can also include shoulders 144 and spacers 142. The combination of shoulders 144 and spacers 142 can allow a user of device 100 to adjust the level of pins 120. For example, more spacers 142 (or larger spacers) can be included between stabilizer 135 and shoulder 144 to lower support 130, which thereby lowers the tips of pins 120. The level of pins 120 may need to be adjusted to ensure that pins 120 come in contact with electrical contacts that are present on the surface of the electronic device being tested once the vacuum pressure is turned on and suction cups 110 compress and draw pins 120 down toward the electrical contacts of the electronic device being tested.

Figure 4:
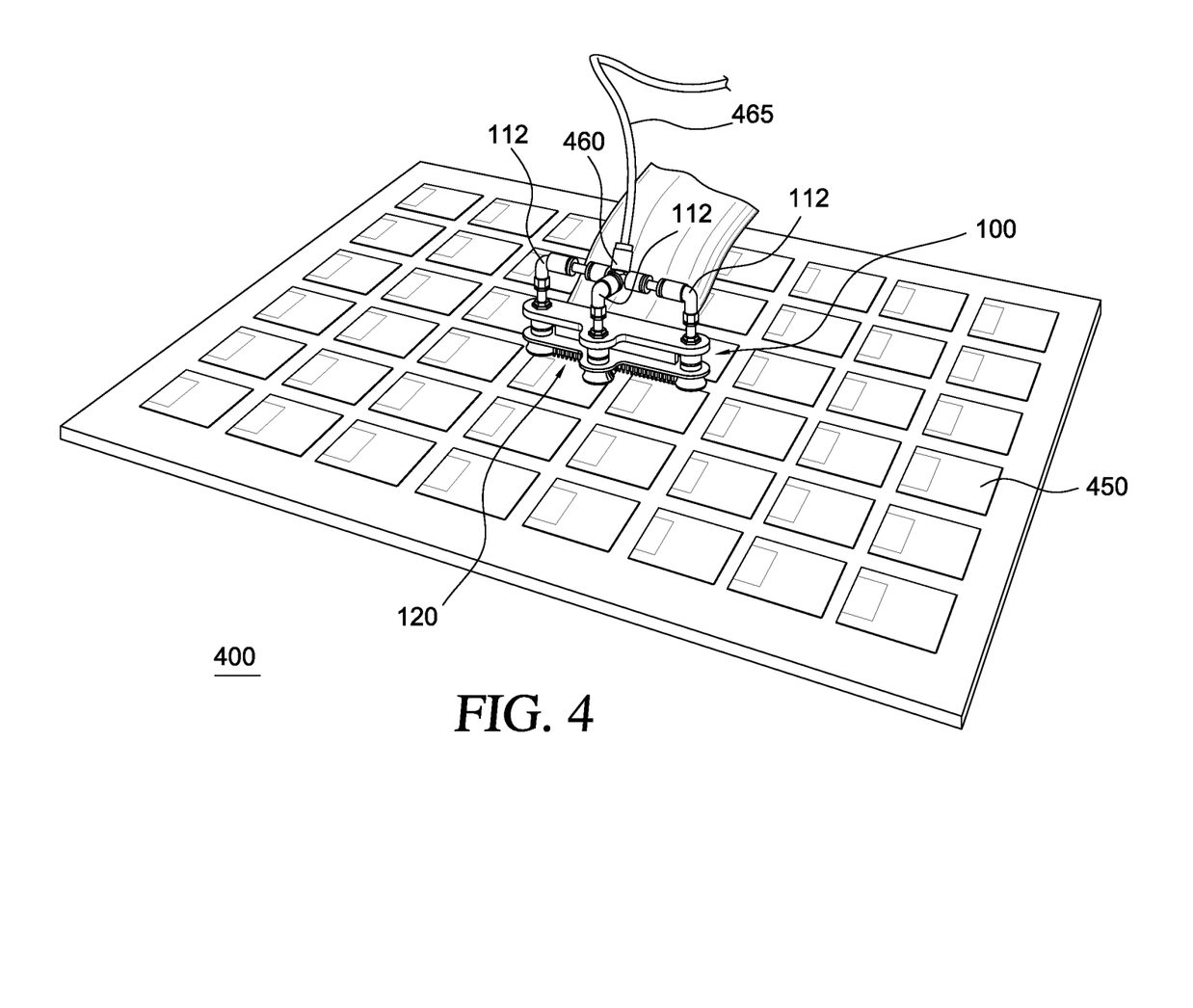
FIG. 4 is an illustration of the device of the embodiment of FIG. 1 in use.

FIG. 4 illustrates an example of system 400, wherein device 100 is in use. In the example of FIG. 4, device 100 is being used to test electronic device 450. Device 100 is being used to make an electrical connection with electronic device 450. Pins 120 make a connection with electrical contacts (not shown) on electronic device 450. Pins 120 carry an electrical signal from a tester (not shown) via connector 140. Electronic device 450 can be any electronic device that needs testing. In one example, electronic device 450 can be a display backplane. In other examples, electronic device 450 can be a flexible display. In a further example, electronic device 450 is a transistor array and/or an integrated circuit that is not a display.

In addition, one end of a vacuum line 465 is attached, to elbows 112 via a vacuum line connector 460. The other end of vacuum line 465 is attached to a vacuum source (not shown) which creates a vacuum pressure. Vacuum line connector 460 receives vacuum line 465, and vacuum line connector 460 is coupled to each of elbows 112. In other embodiments, vacuum line connector 460 may not be present, and instead, a separate vacuum line can be connected to each of elbows 112.

Vacuum line 465 can comprise any material suitable for acting as a vacuum line. In some examples, vacuum line 465 comprises an anti-static material. In examples where vacuum line 465 comprises an anti-static material, vacuum line 465 can be coupled to an electrical ground, which can help prevent electrostatic damage to electronic device 450. As an example, vacuum line 465 can comprise anti-static tubing provided SMC Corporation.

As shown above in FIG. 1, elbows 112 are coupled to second portions 116 of vacuum connector 105 which are coupled to first portions 114 of vacuum connector 105. The first portions 114 are then coupled to suction cups 110. Each of elbows 112, first portions 114, and second portions 116 are hollow, thereby allowing vacuum line 465 to create a suction force between suction cups 110 and electronic device 450 (FIG. 4). In some examples, there is between approximately 25 and 50 grams of force at each of suction cups 110. In other examples, there is more than 50 grams of force at each of suction cups 110. In yet other embodiments, there is less than 25 grams of force at each of suction cups 110.

Figure 5:
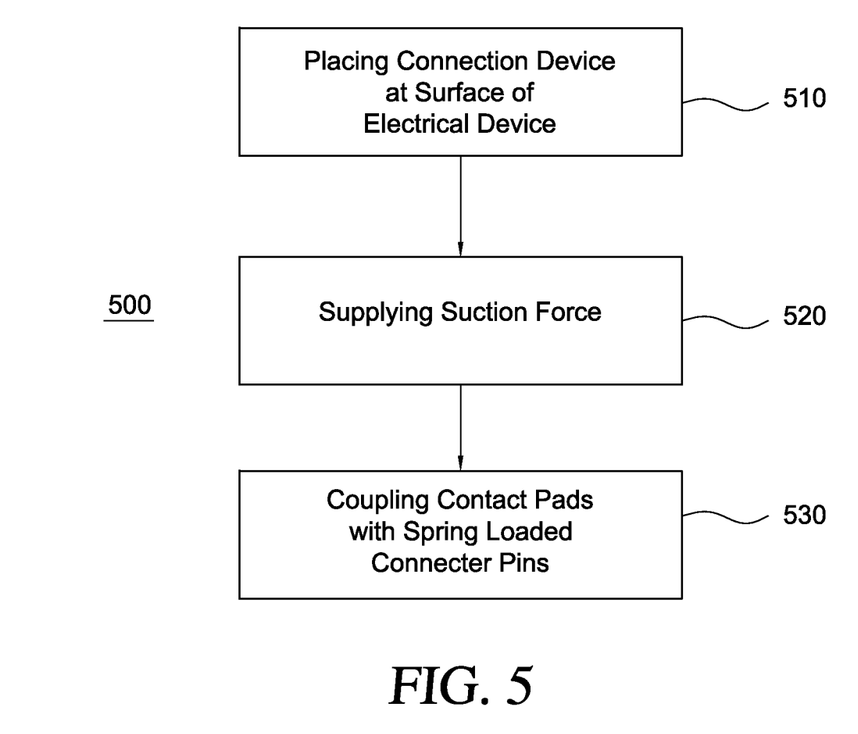
FIG. 5 is a flow chart of a method of making an electrical connection according to another embodiment.

FIG. 5 is a flow chart illustrating an example of a method 500 of making an electrical connection. In some embodiments, method 500 can be considered a method of using a connection device to make electrical connections with an electronic device. In other embodiments, method 500 can be considered a method of testing an electronic device.

Method 500 can include a procedure 510 of placing a connection device at the surface of an electronic device. As an example, the connection device can be device 100 (FIGS. 1-4) and the electronic device can be electronic device 450 (FIG. 4).

Procedure 510 can include placing suction cups of the connection device over and/or onto the surface of the electronic device. As an example, the suction cups can be suction cups 110 from FIGS. 1-3). In some examples, there can be three suction cups. Furthermore, the suction cups can be similar to or the same as (including the arrangement of the suction cups) suction cups 302, 304, and 306 from FIG. 3.

The placing of the suction cups onto the surface of the electronic device can be done visually, i.e., without the use of mechanical or visual aids. A user can align the suction cups into their proper arrangement using only visual cues. In one example, a marker or markers can be fabricated into an electronic device alerting the user to where the suction cups should be placed. For example, during the fabrication of a display backplane, a circle marker with the same perimeter as the suction cups can be created at each location the three suction cups should be placed for proper alignment. Then the user can place each of suction cups 110 inside the perimeter of its respective marker. Proper alignment of the suction cups is the alignment that allows for pins, such as, for example, pins 120 (FIGS. 1-3), to make proper contact with electrical connections on the electronic device. In other examples, there are no markers created, and the user simply places the suction cups so that the pins will be aligned with the corresponding electrical connections on the electronic device.

Next, method 500 continues with a procedure 520 of supplying a suction force. The suction force that is supplied in procedure 520 can be a force that attaches the connection device, via the suction cups, to the electronic device. As an example, the suction force can be vacuum pressure supplied by a vacuum that is coupled to the suction cups. The vacuum can be coupled to the suction cups via a vacuum line. The vacuum line can be similar to or the same as vacuum line 465 (FIG. 4). Furthermore, the vacuum line can be attached to the suction cups by way of a vacuum line connector, elbows, second portions of a vacuum connectors, and first portions of vacuum connectors. The vacuum line connector can be similar to or the same as vacuum line connector 460 (FIG. 4). The elbows can be similar to or the same as elbows 112 (FIGS. 1 and 2). The first portions and the second portions of vacuum connectors can be the same as or similar first portions 114 and second portions 116, respectively (FIGS. 1 and 2).

Method 500 continues with a procedure 530 of coupling (or in some cases, contacting) the electrical connections of the electronic device with connector pins on the connection device. The connector pins can be spring loaded connector pins. In some examples, the spring loaded connector pins can be the same as or similar to spring loaded connector pins 120 (FIGS. 1-3). The electrical connections of the electronic device can be contact pads. The contact pads can be comprised of metal, such as, for example, molybdenum, aluminum, gold, copper, and the like.

The contacting of the electrical connections of the electronic device with the connector pins of the connection device of procedure 530 can be accomplished by using the suction force of procedure 520. For example, the vacuum described above can be used to created a force that attaches the suction cups to the surface of the electronic device. This force can cause the suction cups to compress, which in turn can cause the connector pins of the electronic device to lower, thereby making contact with the electrical connections of the electronic device. In one embodiment, prior to turning on the vacuum, the pins can be held over (but not physically contact) the electrical connections of the electronic device. It should be noted that other forces can be used to bring the connector pins into contact with the electrical connections of the electronic device. For example, a user can simply align the suction cups in their proper alignment. Then, the user can push down on the device, causing the suction cups to compress and the connector pins to come into contact with the electrical contacts. In other examples, a machine can force the connector pins down so that the connector pins make contact with the electrical connections of the electronic device.

Although, according to FIG. 5, the completion of procedure 530 indicates that method 500 is complete, further procedures can be added to method 500. For example, after the completion of procedure 530, where the connector pins have made contact with the electrical connections of the electronic device, electrical tests can be conducted. In one example, a testing device will send electrical signals to the connector pins via a connector, such as, for example connector 140 of FIGS. 1 and 2. The pins will send the signals to the electronic device via the electrical connections of the electronic device. The tester may then interpret and record the results of such tests.

Furthermore, in some embodiments, method 500 can include a procedure of removing the connection device from the electronic device and placing the connection device onto the surface of a second electronic device for testing. In such examples, procedures 510 through 530 can be repeated.

In addition, the procedures of method 500 can be performed at many different periods of time. For example, method 500 can be performed right after the electronic device has been fabricated, and the electronic device is still in a clean room. As an example, the electronic device can be on a moving platform after the completion of fabrication steps when the procedures of method 500 are performed. As another example, the electronic device can be removed from the production facility, and the procedures of method 500 can be performed at a later date. In such an example, the electronic device may be on a platform that is stationary.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that procedures 510, 520 and 530 may be comprised of many different activities, processes, and procedures and be performed by many different modules, in many different orders, that any element of FIGS. 1-5 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A connection device for electrically coupling an electrical device to a test system, the connection device comprising:
   at least one suction cup configured to be coupled to the electrical device;
   spring loaded connector pins configured to electrically couple the electrical device to the test system; and
   a support frame coupled to the at least one suction cup and the spring loaded connector pins;
   wherein:
      the at least one suction cup comprises three suction cups;
      the three suction cups comprise a first suction cup, a second suction cup, and a third suction cup;
      the support frame comprises a first end, a second end opposite of the first end, and a third end between the first end and the second end;
      the first suction cup is coupled to the first end;
      the second suction cup is coupled to the second end; and
      the third suction cup is coupled to the third end.

2. The connection device of claim 1 wherein:
   the at least one suction cup is directly coupled to the support frame; and
   the spring loaded connector pins are directly coupled to the support frame.

3. The connection device of claim 1 wherein:
   the spring loaded connector pins are organized into rows and columns;
   a center of the first suction cup and a center of the second suction cup define a line; and
   the line is located at a midpoint of the rows of the spring loaded connector pins.

4. The connection device of claim 1 wherein:
   the first suction cup has a first perimeter;
   the second suction cup has a second perimeter;
   the third suction has a third perimeter; and
   at least one of:
      at least two of the first perimeter, the second perimeter, and the third perimeter are equal to each other; or
      the third suction cup is coupled to the third end at a midpoint between the first end and the second end.

5. The connection device of claim 1 further comprising at least one of:
   at least one vacuum line coupled to the at least one suction cup wherein the at least one vacuum line creates a vacuum pressure in the at least one suction cup; or
   the test system.

6. The connection device of claim 5 wherein:
   the at least one vacuum line comprises an anti-static material configured to help prevent electrostatic damage to the electrical device when the electrical device is coupled to the at least one suction cup.

7. The connection device of claim 1 further comprising:
   a stabilizer frame coupled to the three suction cups to maintain an alignment of the three suction cups.

8. The connection device of claim 7 wherein at least one of:
   the stabilizer frame comprises an acrylic material, the stabilizer frame being the stabilizer frame coupled to the three suction cups; or
   the connection device further comprises at least one vacuum connector coupled to the stabilizer frame and the at least one suction cup to create a vacuum presence in the at least one suction cup, the stabilizer frame being the stabilizer frame coupled to the three suction cups.

9. The connection device of claim 1 wherein at least one of:
   the support frame comprises FR-4 laminate material; or
   the three suction cups comprise an electrically conductive material.

* * * * *